United States Patent
Ogata et al.

(10) Patent No.: US 8,629,396 B2
(45) Date of Patent: Jan. 14, 2014

(54) UNCOOLED INFRARED IMAGING ELEMENT AND MANUFACTURING METHOD THEREOF

(75) Inventors: Masako Ogata, Aomori-ken (JP); Ikuo Fujiwara, Kanagawa-ken (JP); Hiroto Honda, Kanagawa-ken (JP); Kazuhiro Suzuki, Tokyo (JP); Honam Kwon, Kanagawa-ken (JP); Risako Ueno, Tokyo (JP); Hitoshi Yagi, Kanagawa-ken (JP); Masaki Atsuta, Kanagawa-ken (JP); Koichi Ishii, Kanagawa-ken (JP); Keita Sasaki, Kanagawa-ken (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,388

(22) Filed: Sep. 18, 2011

(65) Prior Publication Data
US 2012/0228496 A1    Sep. 13, 2012

(30) Foreign Application Priority Data

Mar. 11, 2011  (JP) ................................ P2011-054756

(51) Int. Cl.
*H01L 27/146* (2006.01)
(52) U.S. Cl.
USPC ......................................................... 250/332

(58) Field of Classification Search
USPC ......................................................... 250/332
See application file for complete search history.

(56) References Cited

U.S. PATENT DOCUMENTS

| 6,483,111 B1* | 11/2002 | Ishikawa et al. ........... 250/338.4 |
| 7,170,059 B2* | 1/2007 | Wood et al. ................ 250/338.1 |
| 2005/0061980 A1* | 3/2005 | Iida et al. ................... 250/338.4 |

FOREIGN PATENT DOCUMENTS

| JP | 9-199716 | 7/1997 |
| WO | WO 2011/033663 A1 | 3/2011 |

* cited by examiner

*Primary Examiner* — Marcus Taningco
(74) *Attorney, Agent, or Firm* — Oblon, Spivak, McClelland, Maier & Neustadt, L.L.P.

(57) ABSTRACT

An uncooled infrared imaging element includes a pixel region, a device region, and a support substrate. The pixel region includes heat-sensitive pixels. The heat-sensitive pixels are arranged in a matrix and change current-voltage characteristics thereof in accordance with receiving amounts of infrared. The device region includes at least one of a drive circuit and a readout circuit which includes a MOS transistor. The drive circuit drives the heat-sensitive pixels. The readout circuit detects signals of the heat-sensitive pixels. The support substrate is provided with a cavity region to be under pixel region and the MOS transistor.

10 Claims, 20 Drawing Sheets

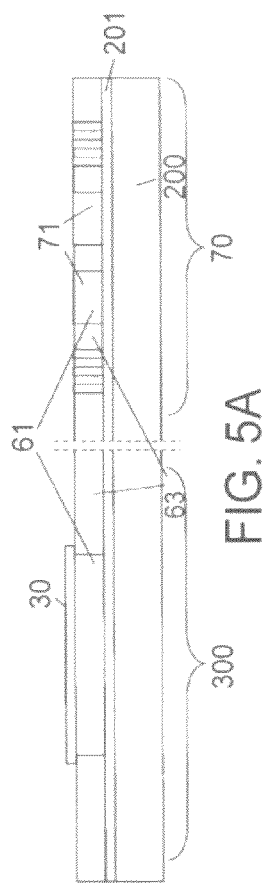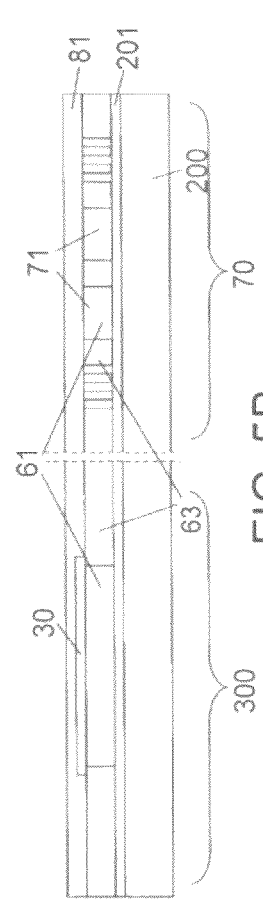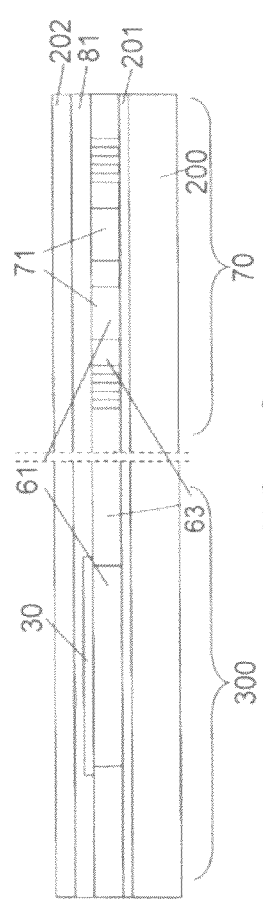

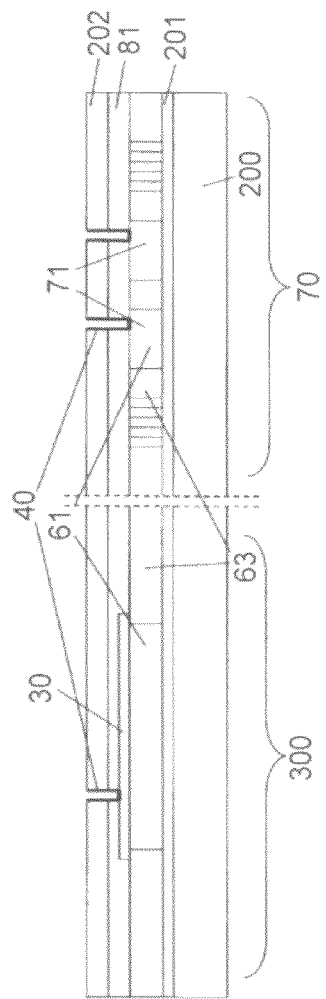
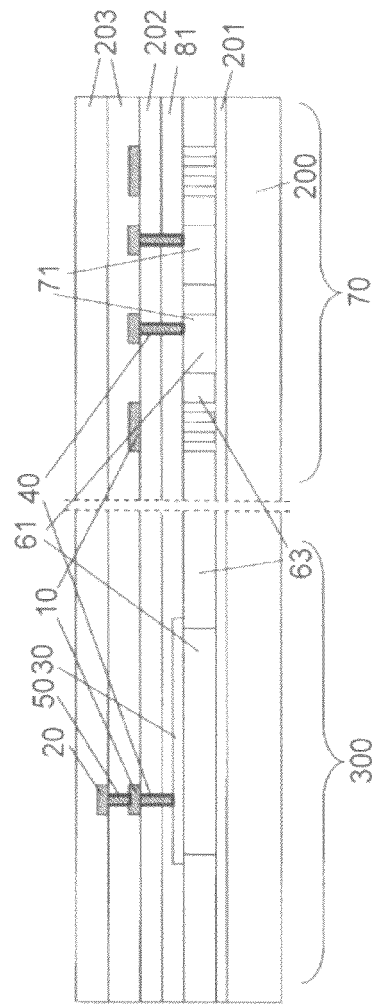
FIG. 6A
FIG. 6B

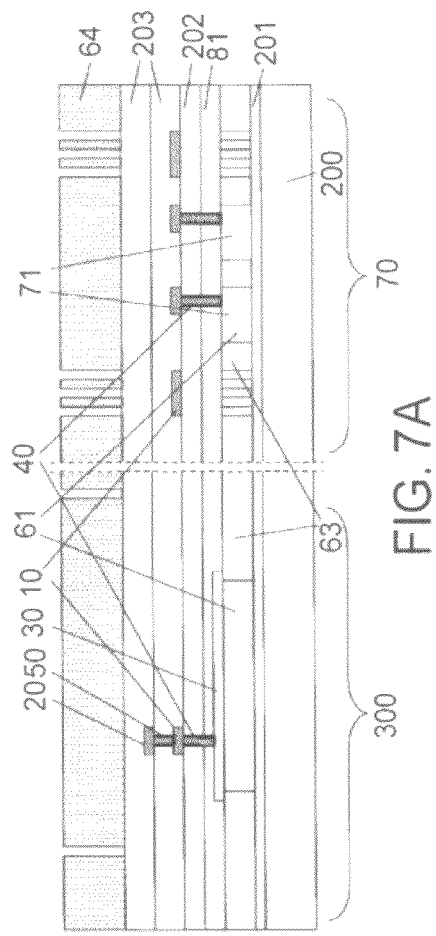
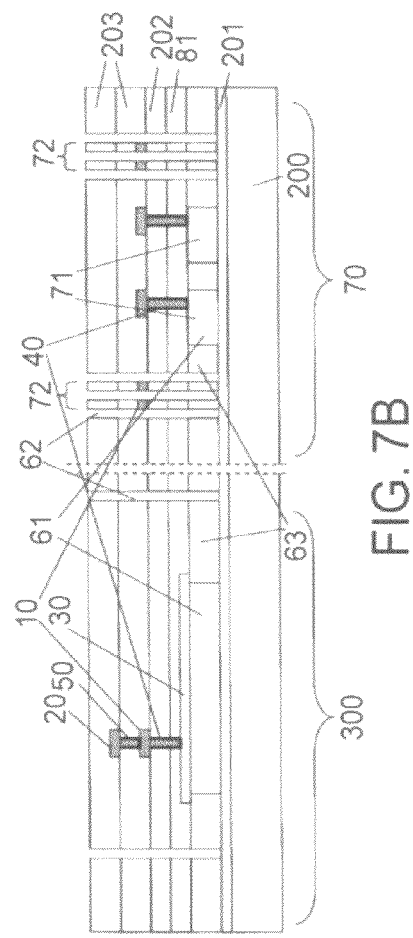
FIG. 7A
FIG. 7B

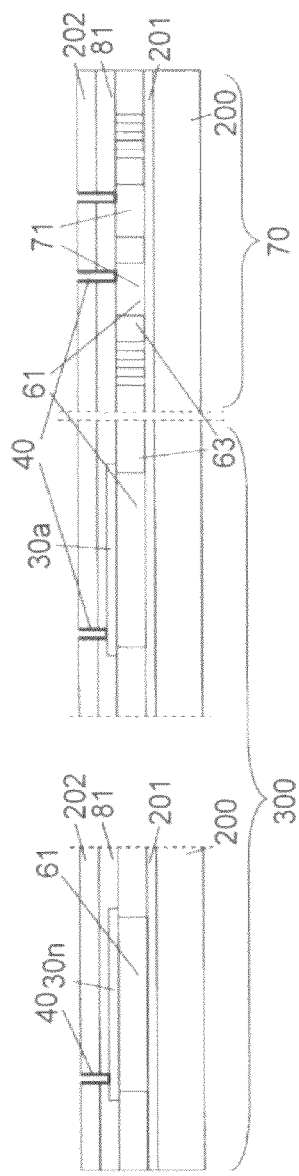
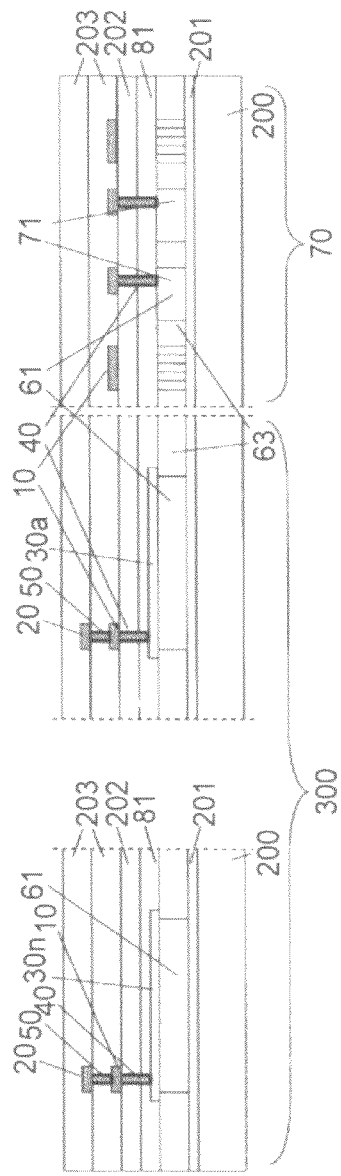
FIG. 12A
FIG. 12B

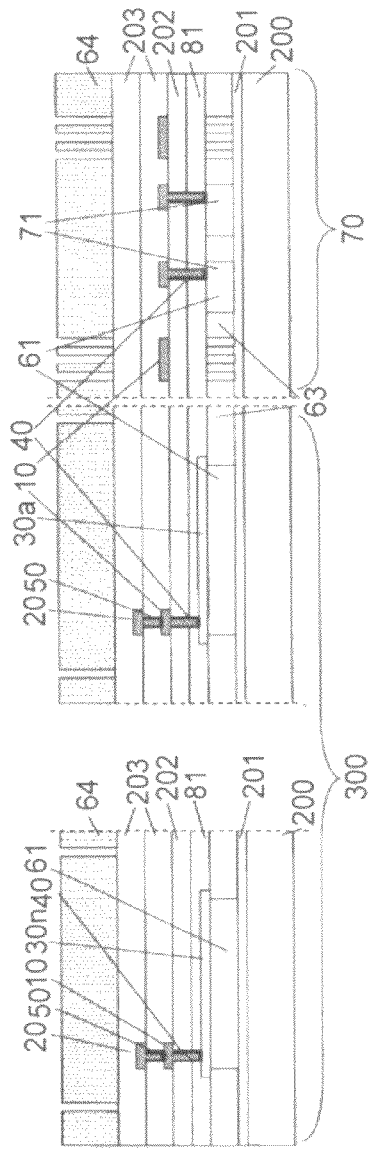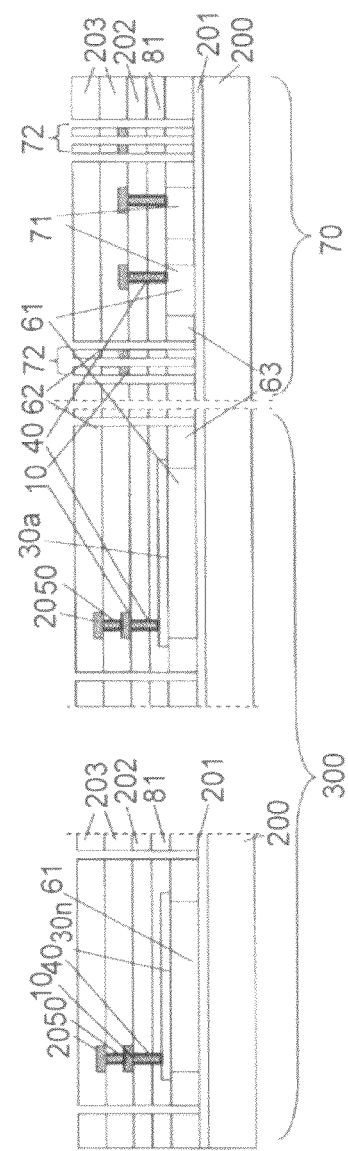
FIG. 13A
FIG. 13B

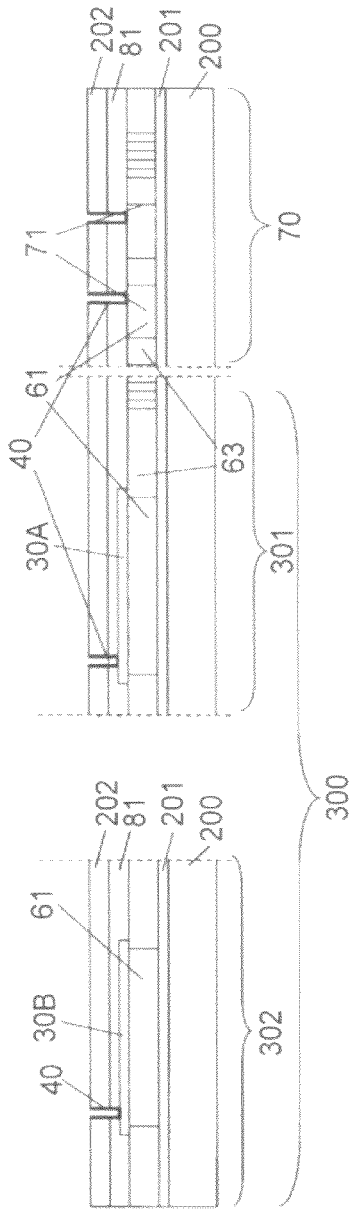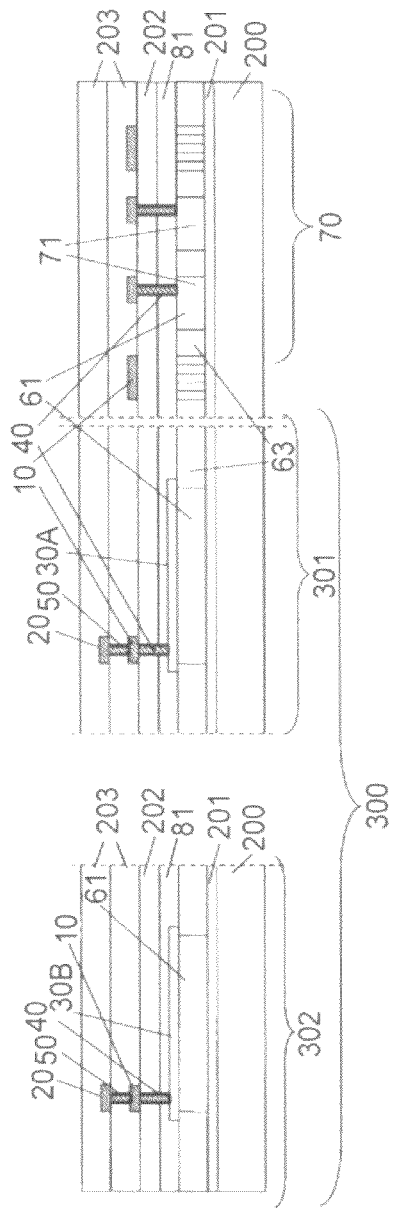
FIG. 18A
FIG. 18B

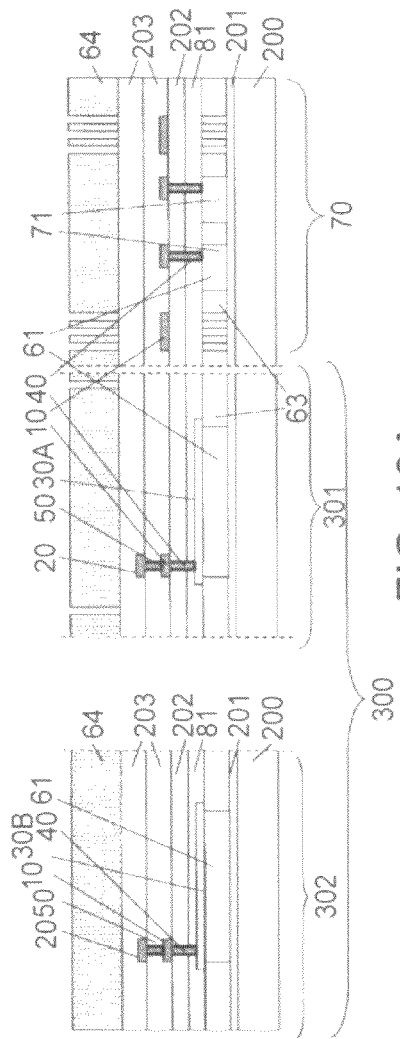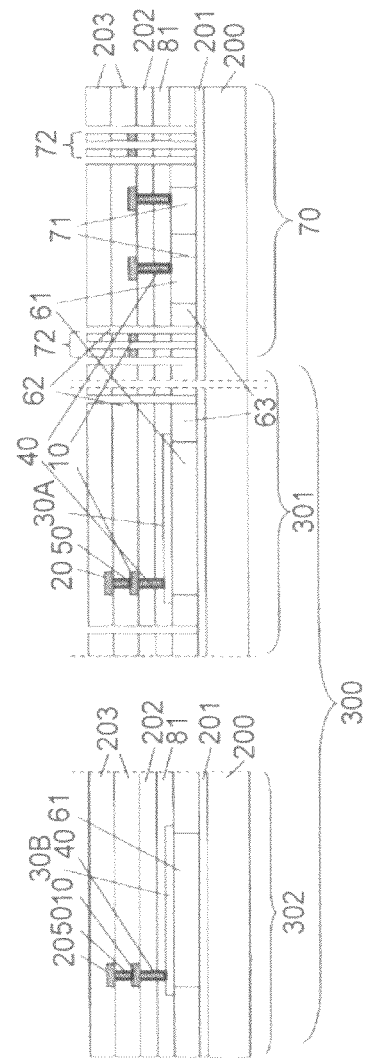

US 8,629,396 B2

UNCOOLED INFRARED IMAGING ELEMENT AND MANUFACTURING METHOD THEREOF

CROSS REFERENCE TO RELATED APPLICATION

This application is based upon and claims the benefit of priority from the prior Japanese Patent Application No. 2011-054756, filed on Mar. 11, 2011, the entire contents of which are incorporated herein by reference.

FIELD

Embodiments relate basically to an uncooled infrared imaging element and a manufacturing method thereof.

BACKGROUND

An uncooled infrared imaging element generally passes a constant forward current through a diode-array to serve as heat-sensitive pixels provided on a Si substrate to detect dVf/dT which is a change in a forward voltage Vf with temperature. The change is a weak signal having several microvolts. Therefore, two or more diodes are series-connected to increase the signal intensity, thereby enhancing a signal-to-noise ratio. This requires voltage driving to be proportional to the number N of diodes so that a voltage of about 10V is applied between the source and drain thereof.

However, there has been a problem that previous uncooled infrared imaging elements could involve a leak current of source-to-drain in some cases. The leak current is caused by applying a high voltage to an SOI transistor included in the element. In the high-voltage applied SOI transistor, an SOI supporting substrate and BOX of the element can serve as a gate and a gate insulator film, respectively, to produce an inversion layer (back channel) at the interface between the gate and the gate insulator. The inversion layer can cause the leak current.

BRIEF DESCRIPTION OF DRAWINGS

Aspects of this disclosure will become apparent upon reading the following detailed description and upon reference to accompanying drawings.

FIGS. 5A to 5C are sectional views showing manufacturing steps of the uncooled infrared imaging element of the first embodiment.

FIGS. 6A and 6B are sectional views showing manufacturing steps of the uncooled infrared imaging element of the first embodiment.

FIGS. 7A and 7B are sectional views showing manufacturing steps of the uncooled infrared imaging element of the first embodiment.

FIGS. 12A and 12B are sectional views showing manufacturing steps of the uncooled infrared imaging element of the second embodiment.

FIGS. 13A and 13B are sectional views showing manufacturing steps of the uncooled infrared imaging element of the second embodiment.

FIGS. 18A and 18B are sectional views showing manufacturing steps of the uncooled infrared imaging element of the third embodiment.

FIGS. 19A and 19B are sectional views showing manufacturing steps of the uncooled infrared imaging element of the third embodiment.

DESCRIPTION

Figure 1:
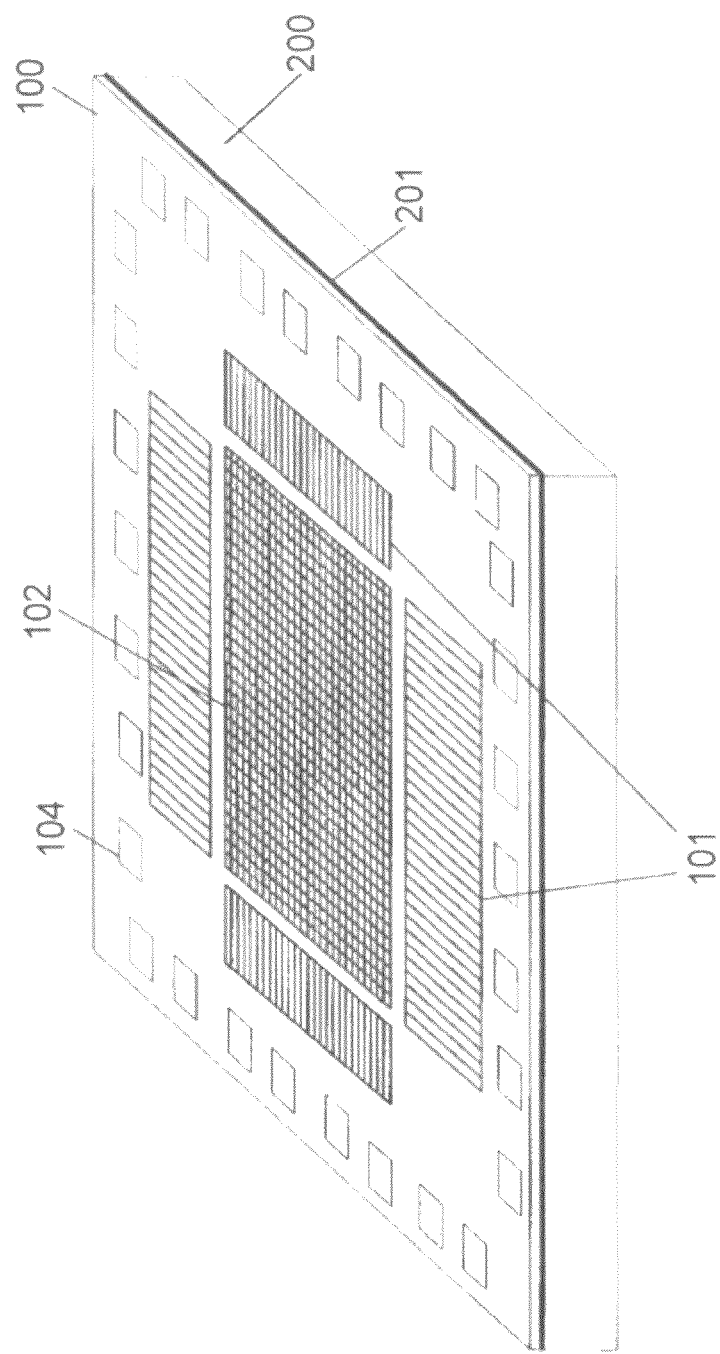
FIG. 1 is a schematic view showing an uncooled infrared imaging element of a first embodiment.

Embodiments will be described in reference with drawings. Wherever possible, the same reference numerals or marks will be used to denote the same or like portions throughout figures. The drawings are conceptual. Therefore, a relationship between a thickness and a width of each portion and a proportionality factor among the respective portions are not necessarily the same as an actual thing. Even when the same portions are drawn, their sizes or proportionality factors may be drawn differently from each other with respect to the drawings.

As will be described below, according to an embodiment, an uncooled infrared imaging element includes a pixel region, a device region, and a support substrate. The pixel region includes heat-sensitive pixels. The heat-sensitive pixels are arranged in a matrix and change current-voltage characteristics in accordance with amounts of infrared received by the pixels. The device region includes at least one of a drive circuit and a readout circuit which includes a MOS transistor. The drive circuit drives the heat-sensitive pixels. The readout circuit detects signals of the heat-sensitive pixels. The support substrate is provided with a cavity region to be under pixel region and the MOS transistor.

First Embodiment

An uncooled infrared imaging element of a first embodiment will be described with reference to FIGS. 1 to 8. Wherever possible, the same reference numerals or marks will be used to denote the same or like portions throughout figures below.

Figure 2:
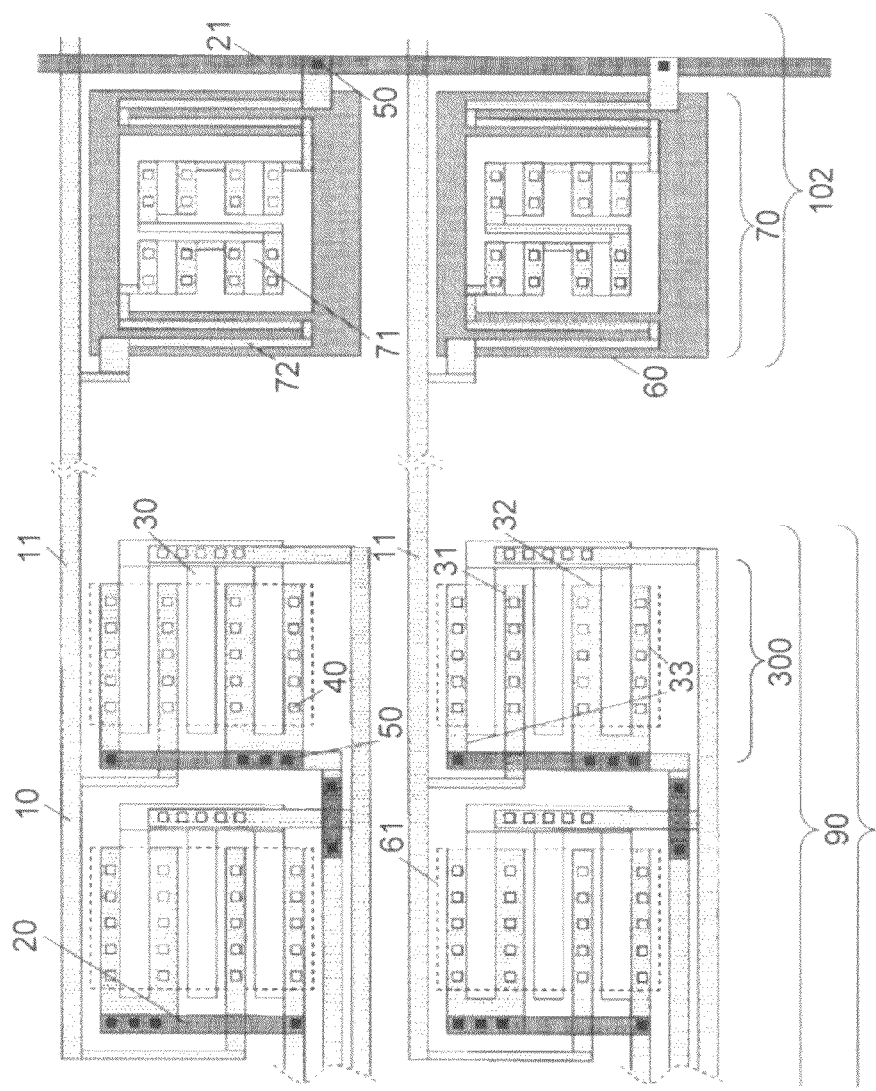
FIG. 2 is a top view of the uncooled infrared imaging element of the first embodiment.

The uncooled infrared imaging element of the first embodiment is outlined. FIG. 1 is a schematic view showing the uncooled infrared imaging element of the first embodiment. FIG. 2 is a top view of the uncooled infrared imaging element of the first embodiment.

As shown in FIG. 1, the uncooled infrared imaging element 100 includes a pixel region 102 to be formed in an SOI region 61 described below and a device region 101. The uncooled infrared imaging element 100 is also connected to an external control circuit via pad metals 104. The pixel region 102 includes p-n junction diodes formed in an array and is thermally insulated from a support substrate 200 and a BOX 201. The device region 101 includes a row selector circuit 90 to drive a row selection line and a readout circuit to be connected to a vertical line 21. Each circuit includes a MOS transistor 300, a capacitor, and a resistor.

FIG. 2 is a schematic view showing an arrangement of pixels and transistors in the uncooled infrared imaging element 100. For example, FIG. 2 shows the row selection circuit 90 to be included in the device region 101 and a heat-sensitive pixel 70. FIG. 2 is a top view of the uncooled infrared imaging element of the first embodiment.

As shown in FIG. 2, a heat-sensitive pixel region 102 includes two or more heat-sensitive pixels 70 formed in an array. Each heat-sensitive pixel 70 includes two or more p-n junction diodes 71 which are formed in an SOI region 61 and is thermally insulated from a substrate by a supporting leg 72 and a cavity region 60 (a first cavity) of the supporting substrate (supporting-substrate cavity 60) under the diodes 71. Moreover, the cavity region 60 is formed by etching the support substrate 200. An anode and a cathode of the p-n junction diode are connected to first metal wiring via a contact 40. The anode side is drawn out as a row selection line 11.

Here, when the heat-sensitive pixel 70 receives infrared, the temperature thereof increases in accordance with an amount of the received infrared to change the IV characteristic of the p-n junction diode 71. A forward current is passed through the p-n junction diode 71 by a constant current source to provide the temperature increase as a change of the forward voltage of the p-n junction diode 71. The change of the forward voltage is transmitted as a change in electric potential to the readout circuit. The change of the forward voltage is so weak a voltage of several μV that two or more diodes are series-connected to increase the change thereof for sensitivity improvement.

For example, when 10 diodes, each having a forward voltage of 0.8V, are series-connected, the pixel including the 10 diodes entirely needs a drive voltage of 8V. Accordingly, it is necessary to apply a drive voltage of at least 8V or more to the row selection line 11, i.e., the output of the row selection circuit 90.

Furthermore, the row selection circuit 90 to apply a drive voltage to the row selection line 11 normally employs an inverter of multistage configuration or a level shifter. The row selection circuit 90 includes a MOS transistor 300 formed in the SOI region 61. The MOS transistor 300 is connected to a first metal line 10 through a contact 40 and a second metal line 20 through a via hole 50. Furthermore, the MOS transistor 300 includes an NMOS transistor and a PMOS transistor.

Here, a balance between the NMOS transistor and the PMOS transistor determines the potential of the row selection line 11. For example, when the MOS transistor 300 shown in FIG. 2 is a PMOS transistor, 8V is applied to a source electrode 32, a body electrode 33, and a gate electrode 30, whereas 0V is applied to a drain electrode 31 in the MOS transistor 300 during a pixel non-selection period, provided that the row selection circuit 90 applies a voltage of 8V to the heat-sensitive pixel 70. In a routine condition, a source-drain current must be a weak current of several pA or less as the gate potential is the same as the source potential.

However, in the SOI region, the supporting substrate and BOX can serve as a gate and a gate insulator film, respectively, to produce an inversion layer at the interface between the gate and the gate insulator, thereby causing a leak current of source-to-drain (back channel). The leak current prevents the MOS transistor 300 from being in a complete off-state in some cases. At this time, the leak current passes through the MOS transistor 300 in the row selection circuit 90 to prevent a routine pixel-selection.

Therefore, the uncooled infrared imaging element of the first embodiment is provided with an etching hole 62 around the device region and the cavity region 60 (the second cavity) of the support substrate 200 under the device region to prevent the inversion layer formed by the gate due to the supporting substrate.

Figure 3:
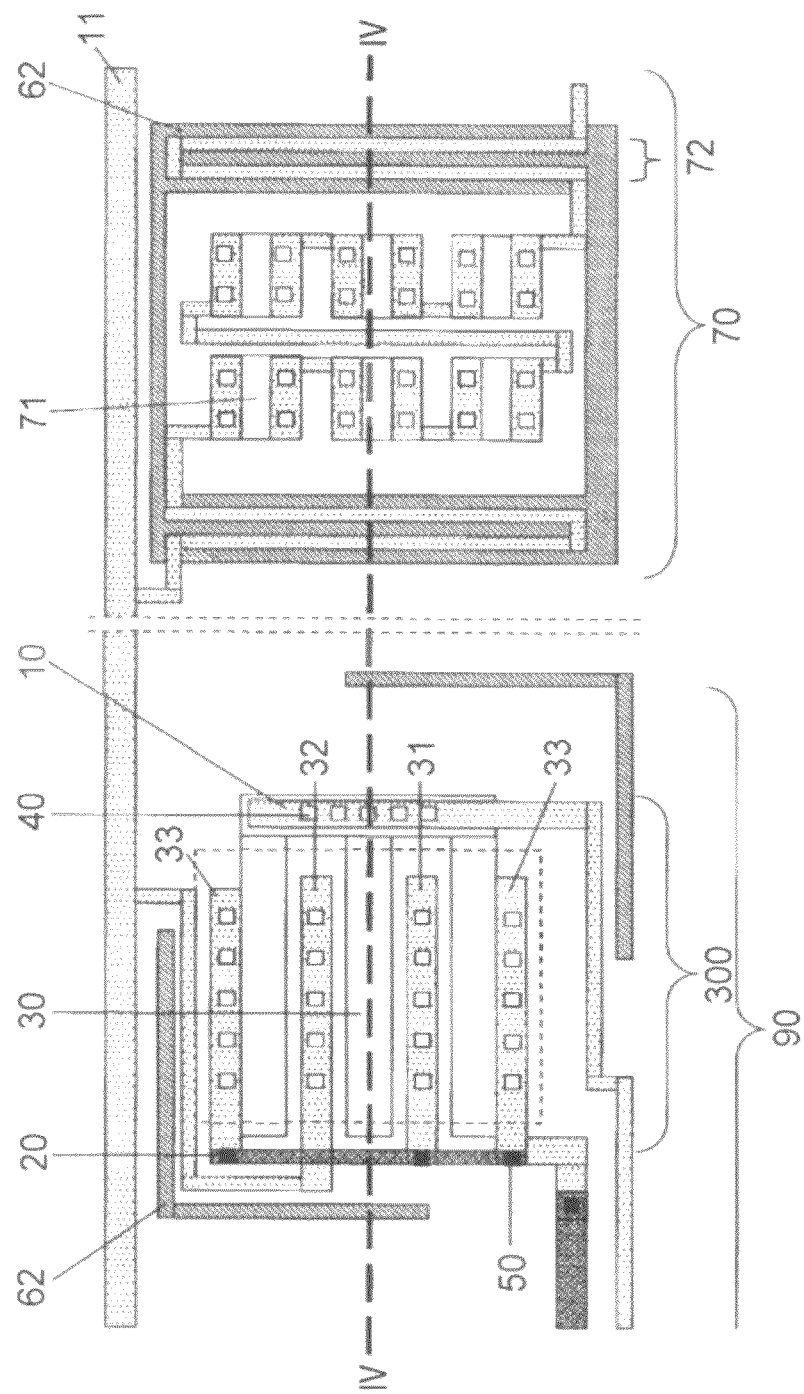
FIG. 3 is a plan view of the uncooled infrared imaging element of the first embodiment.
Figure 4:
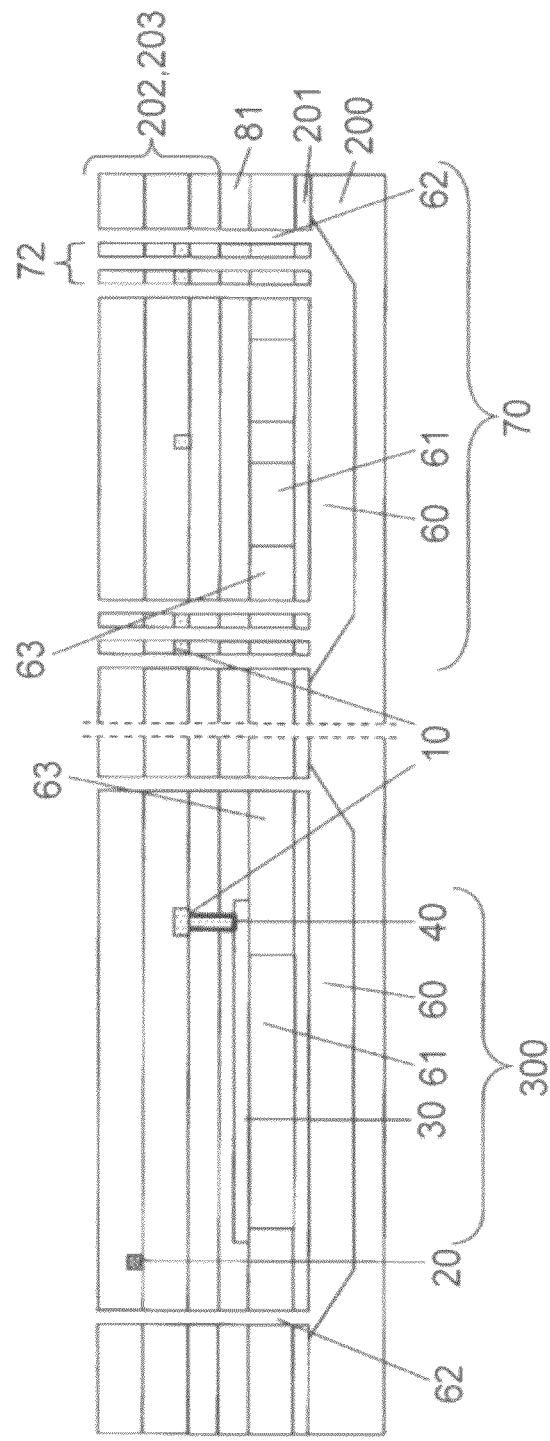
FIG. 4 is a sectional view cut along IV-IV line in FIG. 3.

Here, the detailed configuration of the uncooled infrared imaging element of the first embodiment will be described with reference to FIGS. 3 and 4. FIG. 3 is a plan view of the uncooled infrared imaging element of the first embodiment. FIG. 4 is a sectional view cut along IV-IV line in FIG. 3.

As shown in FIG. 3, the heat-sensitive pixel 70 and the MOS transistor 300 are formed on the same support substrate 200. The heat-sensitive pixel 70 is provided with the series-connected p-n junction diodes 71 and the supporting substrate cavity region 60. The supporting substrate cavity region 60 thermally insulates the p-n junction diodes 71 from the support substrate 200. Furthermore, the heat-sensitive pixel region 102 has the etching hole 62 to form the cavity region on the support substrate 200 and supporting legs 72 to support the p-n junction diodes 71 in the cavity region. Here, the anode and the cathode of the series-connected p-n junction diodes 71 are connected to the first metal wiring 10 through the contact 40, and the anode side is drawn out as the row selection line 11. The row selection line 11 is an output line of the row selection circuit 90, and is connected to the MOS transistor 300. The MOS transistor 300 is regarded as one element included in the row selection circuit 90 in the description of the first embodiment. Alternatively, the MOS transistor 300 can be replaced with a MOS transistor included in peripheral circuits of the imaging element. The peripheral circuits include a readout circuit of a vertical line and a bias circuit.

The MOS transistor 300 is provided with the gate electrode 30 formed by Poly-Si etc. and is connected to the first metal wiring 10 through the contact 40 from the drain terminal, the source terminal, and the body terminal. Moreover, the MOS transistor 300 is provided with the drain electrode 31, the source electrode 32, and the body electrode 33 which are drawn out to the second metal wiring 20 through the interlayer via (the via hole) 50, and is connected to a wiring region in accordance with circuit configurations. Here, the etching hole 62 is formed around the MOS transistor 300 to form a cavity region on the supporting substrate. Therefore, the first metal wiring 10 and the second metal wiring 20 are formed so that the etching hole 62 is beforehand avoided thereby.

Moreover, as shown in FIG. 4, the heat-sensitive pixel 70 and MOS transistor 300 are formed in the SOI region 61 formed above the support substrate 200 and on BOX 201. The heat-sensitive pixel 70 and the MOS transistor 300 are isolated from each other by an STI region 63. A BPSG layer 81 is formed on the gate electrode 30. The contact 40, the first metal wiring 10, the second metal wiring 20, and interlayer dielectric films 202, 203 are further formed on the BPSG layer 81.

The etching holes 62 are formed in the STI region 63 around the MOS transistor 300 and in the STI region 63 around the heat-sensitive pixel 70. The respective supporting substrates 200 have the cavity regions 60 and the supporting legs 72 which are formed around the heat-sensitive pixel 70.

In addition, the etching hole 62 is formed in the STI region as shown in FIG. 4. Alternatively, the etching hole 62 may be formed in the SOI region 61. Alternatively, a portion of the heat-sensitive pixels 70 formed in an array may have a region without the cavity region 60 to serve as a non-sensitive pixel which becomes a standard of the substrate temperature.

The cavity region formed under the MOS transistor 300 increases a distance between the SOI region 61 and the support substrate 200. The SOI region 61 corresponds to a device region where the MOS transistor 300 works.

As a result, an electric field decreases, which is applied between the support substrate 200 and the SOI region 61 via BOX 201. The decrease in the electric field reduces carriers to be induced at a BOX interface, thereby allowing it to prevent the formation of the back channel inversion layer.

Moreover, when the etching hole 62 is provided in the STI region 63 or in the SOI region 62 so that the etching hole 62 reaches BOX 201, a pressure difference is eliminated between a pressure inside the cavity region 60 of the supporting substrate and a vacuum pressure outside the infrared imaging element.

A manufacturing method of the uncooled infrared imaging element of the first embodiment will be described with reference to FIGS. 5 to 8. FIGS. 5A to 8 are sectional views showing manufacturing steps of the uncooled infrared imaging element of the first embodiment.

As shown in FIG. 5A, the p-n junction diode 71 included in the heat-sensitive pixel 70 and the MOS transistor 300 are formed in the SOI region 61 on BOX 201 which is on the support substrate 200. The SOI region 61 is electrically isolated by the STI region 63. The gate electrode 30 is formed using CVD and photolithography.

Next, as shown in FIG. 5B, BPSG81 is deposited on the gate electrode 30.

As shown in FIG. 5C, the interlayer dielectric film 202 is further deposited on BPSG81.

Moreover, as shown in FIG. 6A, the contact hole 40 is formed to be connected to the gate electrode 30. Specifically, a contact pattern is formed using a photolithographic technique. Subsequently the contact hole 40 is formed by RIE. A metal is embedded to the contact hole 40 using CVD and CMP for planarization.

Moreover, as shown in FIG. 6B, a metal, e.g., an aluminum alloy is deposited by sputtering for the first metal wiring 10. The deposited aluminum-alloy film is patterned with photolithography and RIE. Furthermore, the interlayer dielectric film 203 is laminated thereon, and the interlayer via pattern is formed with photolithography. Subsequently, the interlayer via 50 is formed with RIE, CVD, and CMP. Moreover, the second metal wiring 20 is formed by the same process in the same way as the first metal wiring 10. Furthermore, the interlayer dielectric film 203 is laminated.

Furthermore, as shown in FIG. 7A, resist 64 is patterned with photolithography to form etching holes.

Next, as shown in FIG. 7B, etching holes 62 are simultaneously formed with RIE around the MOS transistor 300 and the heat-sensitive pixel 70 to expose the support substrate 200. The supporting leg 72 is simultaneously formed when forming the etching holes 62.

Figure 8:
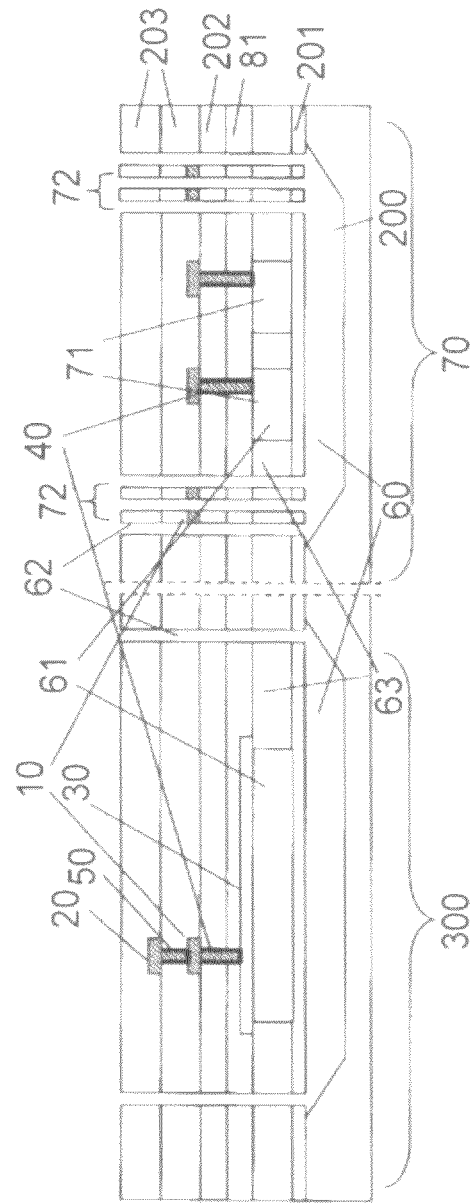
FIG. 8 is a sectional view showing a manufacturing step of the uncooled infrared imaging element of the first embodiment.

Finally, as shown in FIG. 8, the cavity region 60 is simultaneously formed on the support substrate 200 under the MOS transistor 300 and the heat-sensitive pixel 70 with silicon anisotropic wet etching by TMAH (Tetra-Methyl-Ammonium-Hydroxide).

As mentioned above, the manufacturing process of the uncooled infrared imaging element of the first embodiment includes the following steps:
forming the etching holes 62 to form the cavity regions on the support substrate 200 under the heat-sensitive pixel 70 and the MOS transistor 300; and
forming the cavity regions 60 on the support substrate 200 with wet etching in a post process.
The manufacturing process eliminates the need for a preceding process in which wafers are stuck on each other after forming the cavity regions 60 of the support substrate 200 beforehand, thereby enabling it to form the cavity regions 60 efficiently.

Second Embodiment

Figure 9:
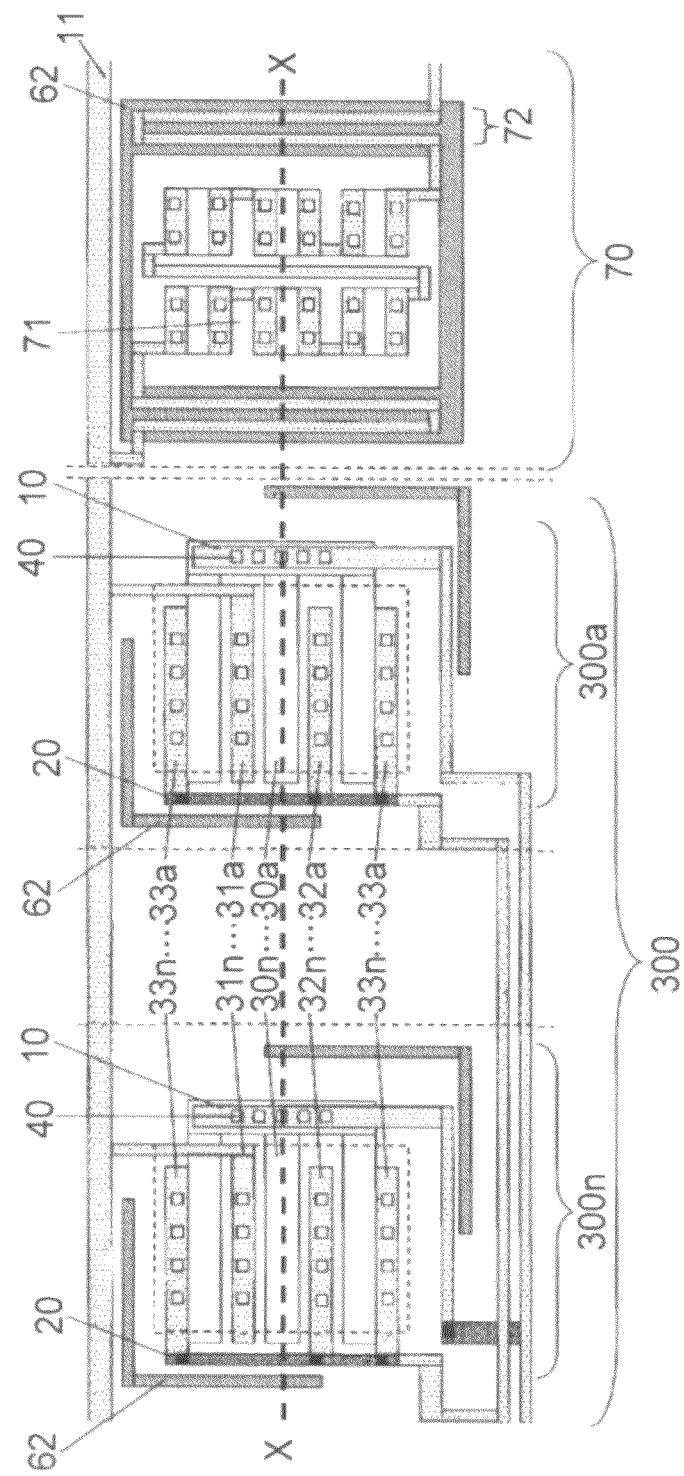
FIG. 9 is a plan view showing an uncooled infrared imaging element of a second embodiment.
Figure 10:
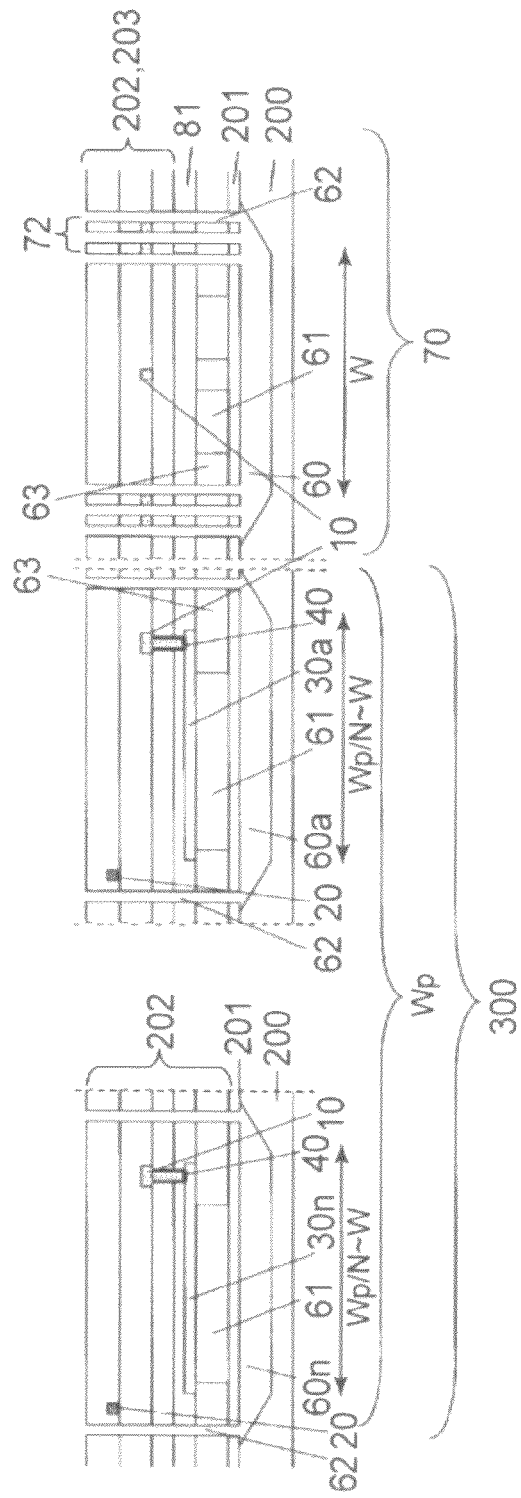
FIG. 10 is a sectional view cut along the line X-X in FIG. 9.

A detailed configuration of an uncooled infrared imaging element of a second embodiment will be described with reference to FIGS. 9 and 10. FIG. 9 is a plan view showing the uncooled infrared imaging element of the second embodiment. FIG. 10 is a sectional view cut along the line X-X in FIG. 9.

The second embodiment differs from the first embodiment in that the MOS transistor 300 is denoted by two or more parallel-connected MOS transistors 300a to 300n. The other elements of the second embodiment excepting the parallel-connected MOS transistors 300a to 300n are the same as those of the first embodiment. Therefore, the same reference numerals or marks will be used to denote the same or like portions throughout figures in the second embodiment.

As shown in FIG. 9, the uncooled infrared imaging element of the second embodiment includes the heat-sensitive pixel 70 and the MOS transistor 300, both having a width of W and being formed on the same wafer. The MOS transistor 300 is formed of the parallel-connected MOS transistors 300a to 300n which have the same gate width. As a result, the total gate width Wp of the MOS transistor 300 is W×N.

The uncooled infrared imaging element of the second embodiment includes gate electrodes 30a to 30n with the same width W. The gate electrodes 30a to 30n are connected from the drain, the source, and the body terminal to the first metal wiring 10 via the contact 40.

Furthermore, the uncooled infrared imaging element of the second embodiment is provided with the drain electrodes 31a to 31n, the source electrodes 32a to 32n, and the body electrodes 33a to 33n. The drain electrodes 31a to 31n are drawn out to the second metal wiring 20 via an interlayer via 50. Moreover, etching holes 62 are arranged around the respective MOS transistors 300a to 300n to form a cavity region on the support substrate 200. The first metal wiring 10 and the second metal wiring 20 are arranged so as to previously avoid the etching holes 62.

Here, the gate electrodes 30a to 30n are short-circuited by the first metal wiring 10. Moreover, the drain electrodes 31a to 31n, the source electrodes 32a to 32n, the body electrodes 33a to 33n are similarly short-circuited by the first metal wiring 10 and the second metal wiring 20.

As shown in FIG. 10, the etching holes 62 are formed in the STI regions 63 around the MOS transistors 300a to 300n and the heat-sensitive pixel 70. Moreover, the support-substrate cavity regions 60, 60a, . . . , and 60n are formed in the support substrate 200 under the heat-sensitive pixel 70 and the MOS transistors 300a to 300n.

Here, the uncooled infrared imaging element of the second embodiment is provided with the whole MOS transistor 300 having a gate width (and length) Wp larger than the width W of the heat-sensitive pixel 70. The whole MOS transistor 300 is divided into the MOS transistors 300a to 300n so that the widths of the respective MOS transistors 300a to 300n are equal to the width W of the heat-sensitive pixel 70 as shown in FIGS. 9 and 10.

When the MOS transistors 300a to 300n having the respective gate widths W=Wp/N are formed, the gate electrodes 30a to 30n, the source electrodes 32a to 32n, and the body electrodes 33a to 33n are short-circuited.

Therefore, the MOS transistors 300a to 300n can serve as a large MOS transistor 300 having an entire gate width Wp. As a result, the support-substrate cavity region 60 under the heat-sensitive pixel 70 has almost the same area as the support-substrate cavity regions 60a to 60n under the respectively divided MOS transistors. This enables it to form the support-substrate cavity regions efficiently within the same etching time in the etching of the support substrate 200.

Moreover, in the uncooled infrared imaging element of the second embodiment, a MOS transistor has a small volume every support-substrate cavity region as a result of the division of the MOS transistor. The small volume of each MOS transistor reduces the heat capacity thereof to prevent the characteristic degradation of the MOS transistor 300 due to its self heating.

A manufacturing method of the uncooled infrared imaging element of the second embodiment will be described with reference to FIGS. 11 to 14. FIGS. 11A to 14 are sectional views showing manufacturing steps of the uncooled infrared imaging element of the second embodiment.

Figure 11A:
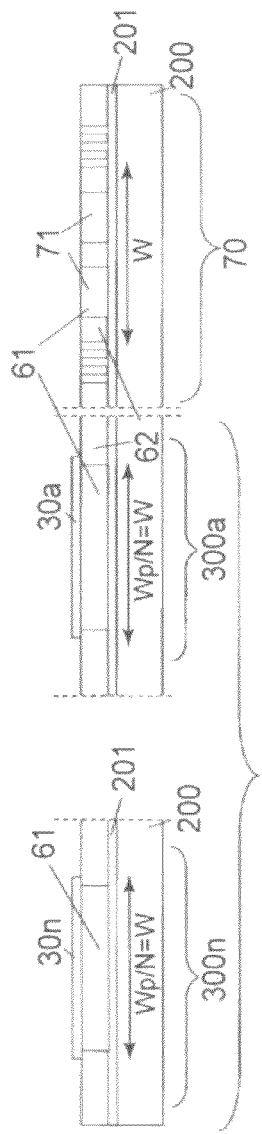
FIGS. 11A to 11C are sectional views showing manufacturing steps of the uncooled infrared imaging element of the second embodiment.

As shown in FIG. 11A, the p-n junction diode 71 and MOS transistors 300a to 300n are formed in the SOI region 61 on BOX 200 being on the support substrate 200. The SOI region 61 is electrically isolated by the STI region 63. The p-n junction diode 71 is included in the p-n junction diode 71. The gate electrode 30 is formed using CVD and photolithography.

The MOS transistors 300a to 300n are formed so that the widths of the respective MOS transistors 300a to 300n are equal to the width of the p-n junction diode 71. The number N of the MOS transistors 300a to 300n are determined in accordance with the gate width (or length) of the MOS transistor 300.

Figure 11B:
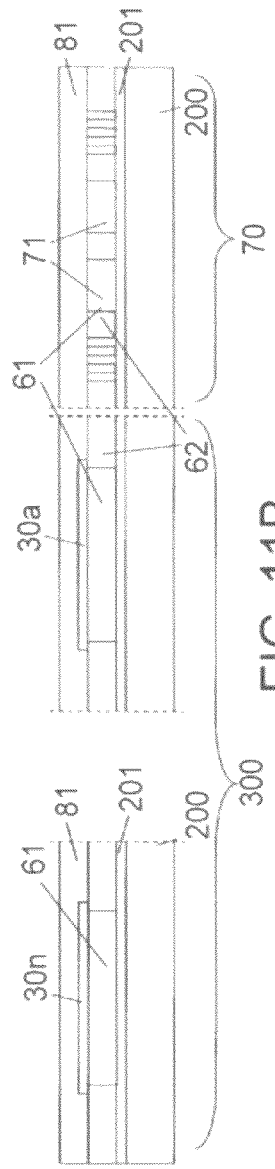

As shown in FIG. 11B, BPSG81 is laminated on the gate electrodes 30a to 30n.

Figure 11C:
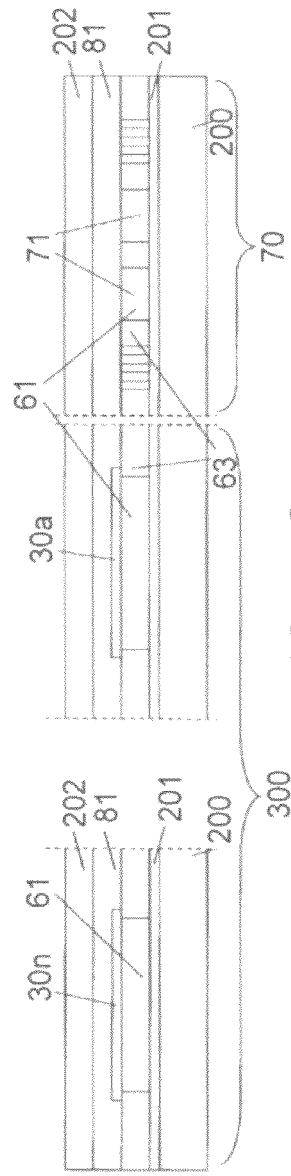

As shown in FIG. 11C, the interlayer dielectric film 202 is further laminated on BPSG81.

As shown in FIG. 12A, the contact hole 40 is formed to be connected to the gate electrodes 30a to 30n. A contact pattern is formed using a photolithographic technique. Subsequently the contact hole 40 is formed by RIE. A metal is embedded to the contact hole 40 using CVD and CMP.

As shown in FIG. 12B, a metal, e.g., an aluminum alloy is deposited by sputtering for the first metal wiring 10. The deposited aluminum-alloy film is patterned with photolithography and RIE. Furthermore, the interlayer dielectric film 203 is laminated thereon, and the interlayer via pattern is formed with photolithography. Subsequently, the interlayer via 50 is formed with RIE, CVD, and CMP. The second metal wiring 20 is formed in the same process in the same way as the first metal wiring 10. Furthermore, the interlayer dielectric film 203 is laminated. The layout of the first metal wiring 10 and the second metal wiring 20 is made so that the gate electrodes 30a to 30n, the drain electrodes 31a to 31n, the source electrodes 32a to 32n, and the body electrodes 33a to 33n of the MOS transistors 300a to 300n are short-circuited by the first metal wiring 10 and the second metal wiring 20.

As shown in FIG. 13A, resist 64 is patterned with photolithography to form etching holes.

As shown in FIG. 13B, etching holes 62 are simultaneously formed with RIE around the MOS transistors 300a to 300n and the heat-sensitive pixel 70 to expose the support substrate 200. The supporting leg 72 is simultaneously formed when forming the etching holes 62.

Figure 14:
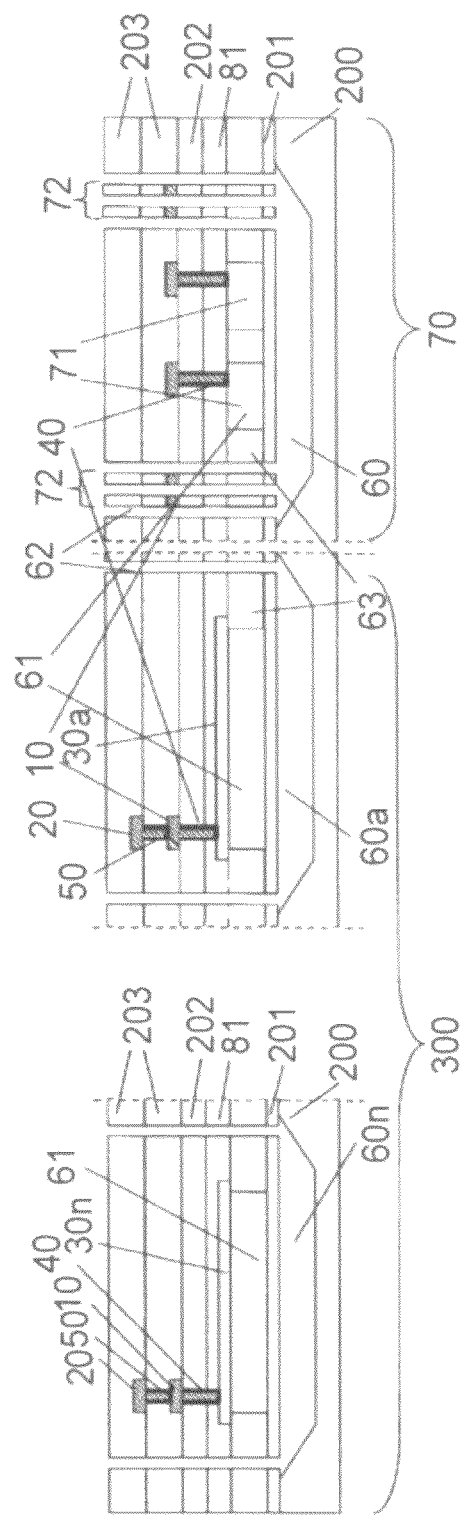
FIG. 14 is a sectional view showing a manufacturing step of the uncooled infrared imaging element of the second embodiment.

Finally, as shown in FIG. 14, the cavity region 60 is simultaneously formed on the support substrate 200 and under both the MOS transistors 300a to 300n and the heat-sensitive pixel 70 with silicon anisotropic wet etching by TMAH (Tetra-Methyl-Ammonium-Hydroxide).

Thus, the uncooled infrared imaging element of the second embodiment is provided with the whole MOS transistor 300 having a gate width (and length) Wp larger than the width W of the heat-sensitive pixel 70. The whole MOS transistor 300 is divided into the MOS transistors 300a to 300n having widths W. This enables it to efficiently form the MOS transistors 300a to 300n having a cavity region thereunder with alkali wet etching.

Third Embodiment

Figure 15:
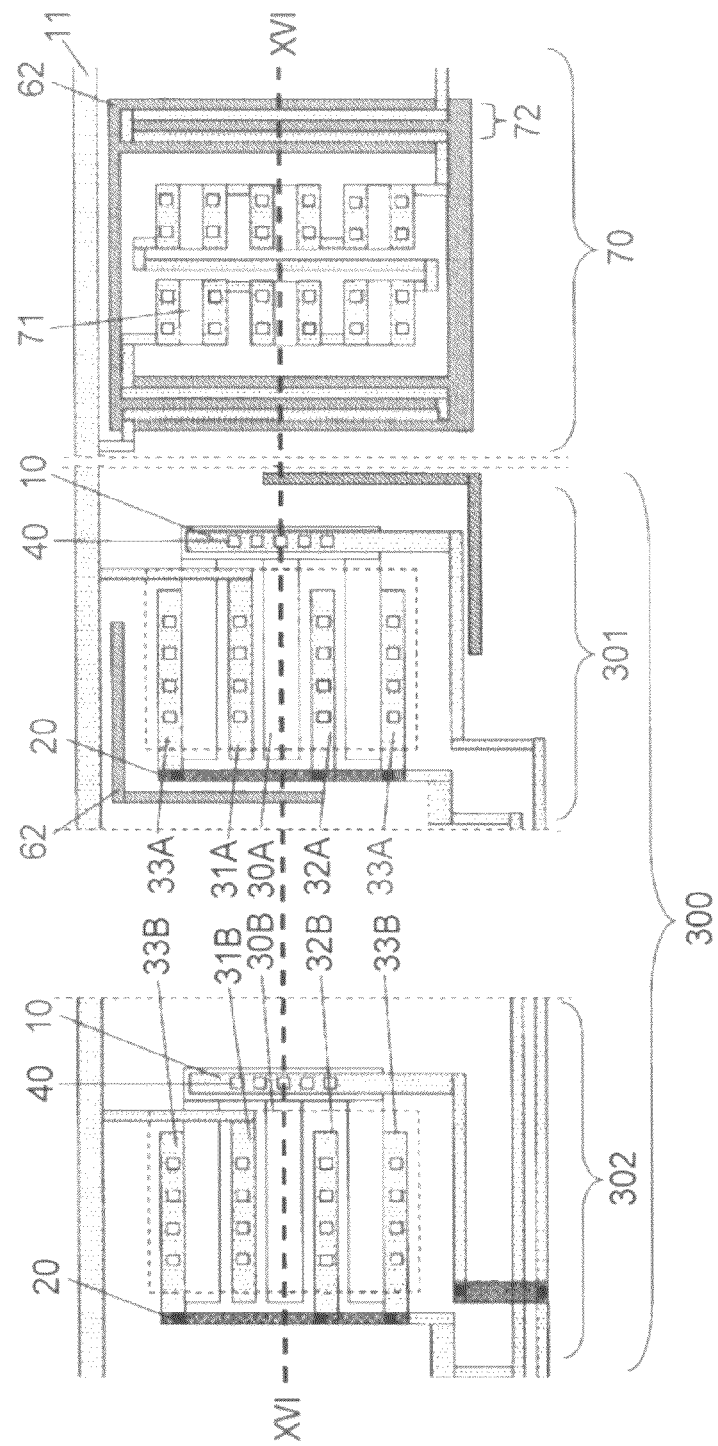
FIG. 15 is a plan view of an uncooled infrared imaging element of a third embodiment.
Figure 16:
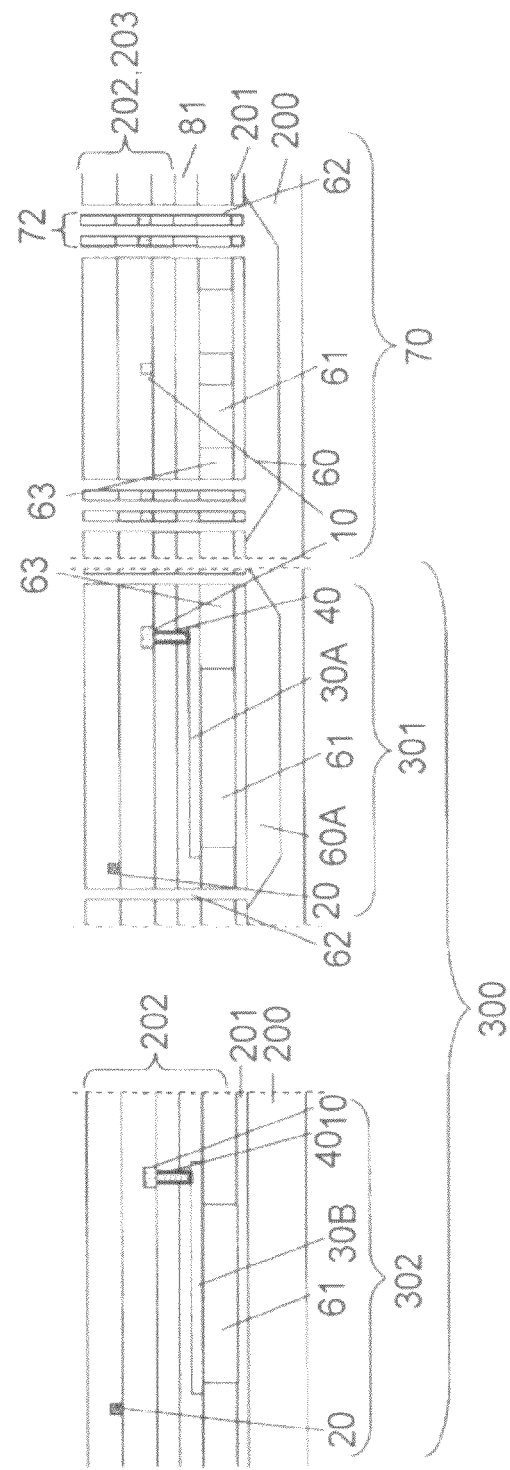
FIG. 16 is a sectional view cut along XVI-XVI line in FIG. 15.

A detailed configuration of an uncooled infrared imaging element of a third embodiment will be described with reference to FIGS. 15 and 16. FIG. 15 is a plan view of the uncooled infrared imaging element of the third embodiment. FIG. 16 is a sectional view cut along XVI-XVI line in FIG. 15.

The third embodiment differs from the first embodiment in that the third embodiment further includes a PMOS transistor 301 and an NMOS transistor 302. The others of the third embodiment excepting the PMOS and NMOS transistors 301, 302 are the same as those of the first embodiment. Therefore, the same reference numerals or marks will be used to denote the same or like portions throughout figures in the third embodiment.

As shown in FIG. 15, the heat-sensitive pixel 70, the PMOS and NMOS transistors 301, 302 are formed within the same support substrate 200 in the uncooled infrared imaging element of the third embodiment. The uncooled infrared imaging element of the third embodiment is provided with the gate electrodes 30A and 30B, each being connected from the drain, source, and body terminals to the first metal wiring 10 via the contact 40.

Furthermore, the uncooled infrared imaging element of the third embodiment is provided with the drain electrodes 31A, 31B, the source electrodes 32A, 32B and the body electrodes 33A, 33B, all of which are drawn out to the second metal wiring 20 through the interlayer via 50. Here, the etching hole 62 is formed around the PMOS transistor 301 to make a cavity on the supporting substrate. Therefore, the first metal wiring 10 and the second metal wiring 20 are formed so that the etching hole 62 is beforehand avoided thereby.

As shown in FIG. 16, the etching holes 62 are formed in the STI region 63 around the PMOS transistor 300 and in the STI region 63 around the heat-sensitive pixel 70. The respective supporting substrates 200 have the support-substrate cavity regions 60 and 60A under the respective STI regions. The support substrate 200 has no cavity region under the NMOS transistor 302.

Thus, in the uncooled infrared imaging element of the third embodiment, the support substrate has a cavity region under the PMOS transistor 301. The cavity region under the PMOS transistor 301 prevents the formation of the back channel.

Here, in standard uncooled infrared imaging elements, the support substrate 200 and the source body terminal of the NMOS transistor 302 are grounded for the operation of the standard uncooled infrared imaging elements. Therefore, the NMOS transistor 302 forms no back channel without a cavity region thereunder. That is, the back channel should be eliminated only in the PMOS transistor 301, thereby allowing it to omit to form the etching hole for the NMOS transistor 302.

A manufacturing method of the uncooled infrared imaging element of the third embodiment will be described with reference to FIGS. 17 to 20. FIGS. 17 to 20 are sectional views showing manufacturing steps of the uncooled infrared imaging element of the third embodiment.

Figure 17A:
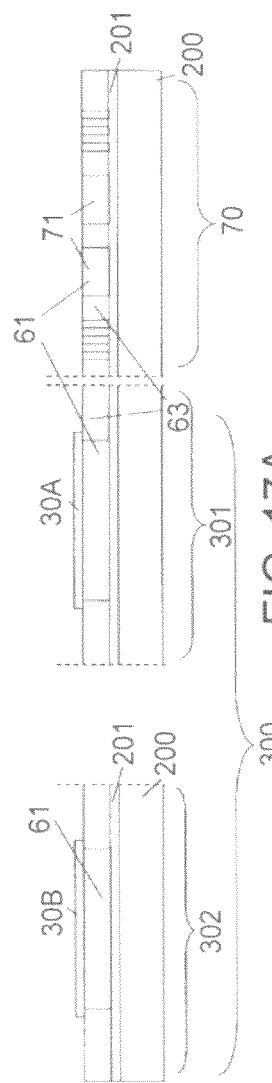
FIGS. 17A to 17C are sectional views showing manufacturing steps of the uncooled infrared imaging element of the third embodiment.

As shown in FIG. 17A, the p-n junction diode 71, the PMOS transistor 301, and the NMOS transistor 302 are formed in the SOI region 61 on BOX 201 being on the support substrate 200. The p-n junction diode 71, the PMOS transistor 301, and the NMOS transistor 302 are included in the heat-sensitive pixel 70. The SOI region 61 is electrically isolated by the STI region 63. The gate electrode 30 is formed using CVD and photolithography.

Figure 17B:
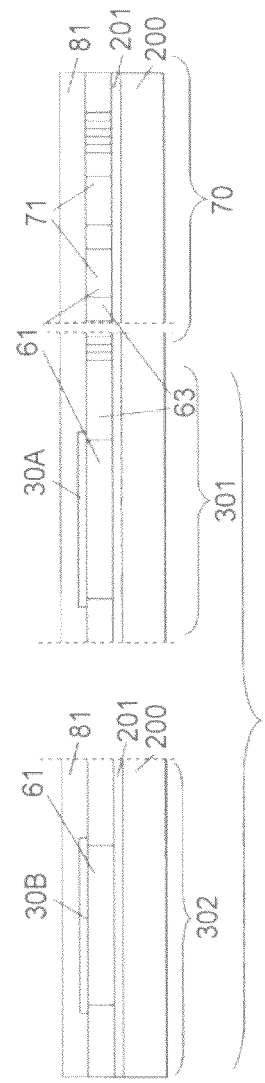

Next, as shown in FIG. 17B, BPSG81 is deposited on the gate electrodes 30A and 30B.

Figure 17C:
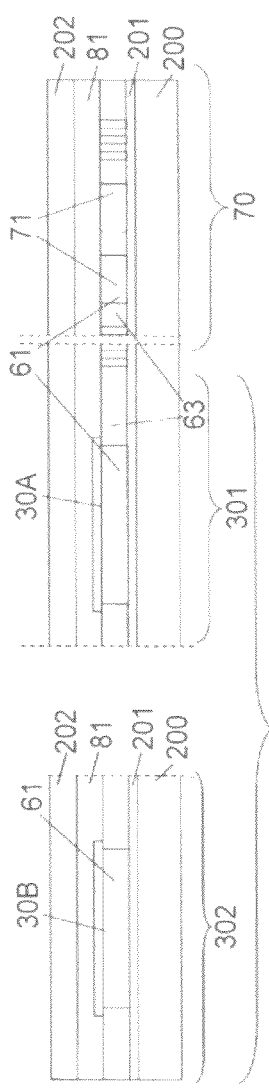

As shown in FIG. 17C, the interlayer dielectric film 202 is further deposited on BPSG81.

Moreover, as shown in FIG. 18A, the contact hole 40 is formed to be connected to the gate electrodes 30A and 30B. Specifically, a contact pattern is formed using a photolithographic technique. Subsequently the contact hole 40 is formed by RIE. A metal is embedded to the contact hole 40 using CVD and CMP.

Moreover, as shown in FIG. 18B, a metal, e.g., an aluminum alloy is deposited by sputtering for the first metal wiring 10. The deposited aluminum-alloy film is patterned with photolithography and RIE. Furthermore, the interlayer dielectric film 203 is laminated thereon, and the interlayer via pattern is formed with photolithography. Subsequently, the interlayer via 50 is formed with RIE, CVD, and CMP. The second metal wiring 20 is formed in the same way as the first metal wiring 10. The interlayer dielectric film 203 is further laminated.

Furthermore, as shown in FIG. 19A, resist 64 is patterned with photolithography to form etching holes.

Next, as shown in FIG. 19B, etching holes 62 are simultaneously formed with RIE around the PMOS and NMOS transistors 300a, 300b and the heat-sensitive pixel 70 to expose the support substrate 200. The supporting leg 72 is simultaneously formed when forming the etching holes 62.

Figure 20:
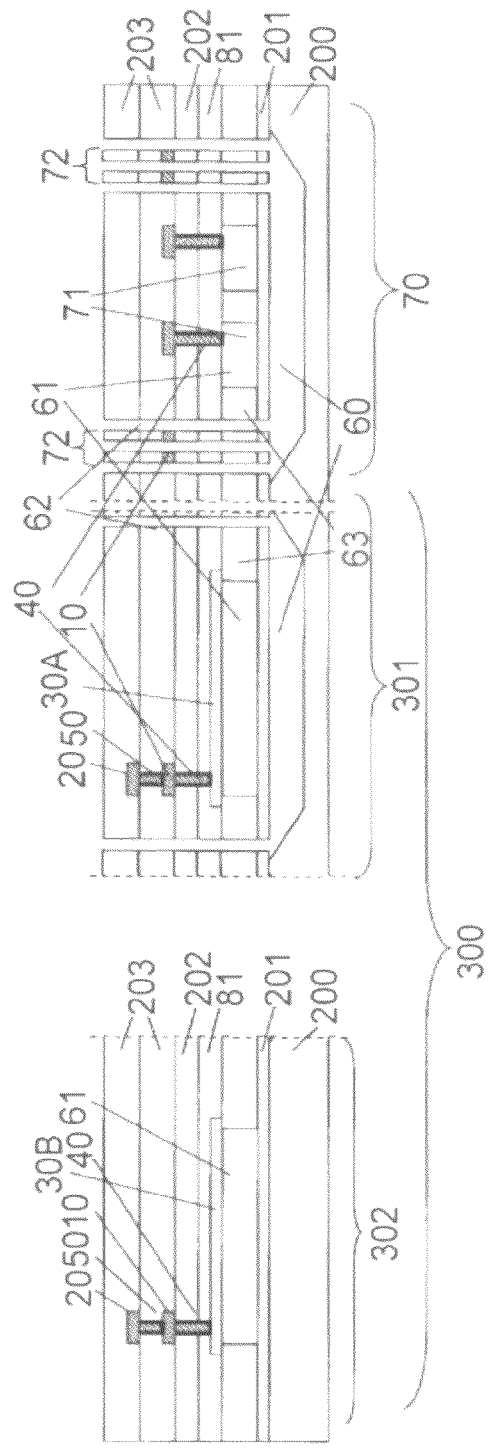
FIG. 20 is a sectional view showing a manufacturing step of the uncooled infrared imaging element of the third embodiment.

Finally, as shown in FIG. 20, the cavity region 60 is simultaneously formed inside the support substrate 200 under the PMOS transistor 300 and the heat-sensitive pixel 70 with silicon anisotropic wet etching by TMAH (Tetra-Methyl-Ammonium-Hydroxide).

As mentioned above, the manufacturing process of the uncooled infrared imaging element of the third embodiment includes the following steps:
forming the etching holes 62 to form a cavity on the support substrate 200 only under the PMOS transistor 301 except for the NMOS transistor 302; and
forming the cavity region 60 on the support substrate 200 with wet etching in a post process.
The manufacturing process eliminates the formation of the etching holes 62 to form a cavity on the support substrate 200 just under the NMOS transistor 302. Therefore, it is possible to select a MOS transistor which is to be provided with a cavity region thereunder.

Alternatively, the selection of the MOS transistor 300 to be provided with the cavity region thereunder is not limited to the selection in the third embodiment. Alternatively, desired MOS transistors may be selected from two or more NMOS transistors 302 or PMOS transistors to form cavity regions under the desired MOS transistors.

As described above, the etching holes 62 can be formed in the STI region 63 or therearound to form a cavity region on the support substrate 200 under the MOS transistors 300. The support-substrate cavity region 60 can be simultaneously formed when forming a cavity region under the heat-sensitive pixel 70.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. An uncooled infrared imaging element, comprising:
    a support substrate having a pixel region and a device region, the support substrate including a first cavity in the pixel region and a second cavity in the device region;
    a plurality of heat-sensitive pixels provided above the first cavity, the pixels being arranged in a matrix and having current-voltage characteristics to be changed in accordance with amounts of infrared received by the pixels; and
    a MOS transistor provided above the second cavity.
2. The element according to claim 1, wherein
    a hole is provided around the MOS transistor and leads to the second cavity.
3. The element according to claim 1, wherein
    two or more MOS transistors are provided above the second cavity.
4. The element according to claim 3, wherein
    the width of the heat-sensitive pixel is same as the gate width of the MOS transistor.
5. The element according to claim 1, wherein
    the MOS transistor includes an NMOS transistor and a PMOS transistor; and
    only a part of the support substrate under the PMOS transistor is provided with the second cavity.
6. The element according to claim 5, wherein
    the NMOS transistor and the PMOS transistor are connected in series, and form a row selection circuit.
7. The element according to claim 1, wherein
    an insulating film is provided between the support substrate and the heat-sensitive pixel and between the support substrate and the MOS transistor.
8. The element according to claim 1, wherein
    the heat-sensitive pixel includes a p-n junction diode, the diode is provided above the first cavity.
9. The element according to claim 8, wherein
    the heat-sensitive pixel further includes a supporting leg to support the diode above the first cavity, the supporting leg is provided above the first cavity.
10. The element according to claim 1, wherein
    the depth of the first cavity is substantially equal to the depth of the second cavity.

* * * * *